(12) United States Patent
Peiris et al.

(10) Patent No.: US 8,340,602 B1
(45) Date of Patent: Dec. 25, 2012

(54) POWER AMPLIFIER LINEARIZATION SYSTEM AND METHOD

(75) Inventors: Bemini Hennadige Janath Peiris, Sunnyvale, CA (US); Sundar G. Sankaran, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 522 days.

(21) Appl. No.: 12/580,836

(22) Filed: Oct. 16, 2009

(51) Int. Cl.
*H04B 1/04* (2006.01)

(52) U.S. Cl. ..................................... 455/114.3; 455/126

(58) Field of Classification Search ............... 455/114.2, 455/114.3, 115.1, 115.2, 126, 127.2
See application file for complete search history.

(56) References Cited

U.S. PATENT DOCUMENTS

| | | | | |
|---|---|---|---|---|
| 5,049,832 A * | 9/1991 | Cavers | | 330/149 |
| 5,867,065 A * | 2/1999 | Leyendecker | | 330/149 |
| 5,923,712 A * | 7/1999 | Leyendecker et al. | | 375/297 |
| 6,141,390 A * | 10/2000 | Cova | | 375/297 |
| 6,985,704 B2 * | 1/2006 | Yang et al. | | 455/126 |
| 7,139,534 B2 | 11/2006 | Tanabe et al. | | |
| 7,184,721 B2 | 2/2007 | Asirvatham et al. | | |
| 7,274,748 B1 | 9/2007 | Khlat | | |
| 7,346,317 B2 | 3/2008 | Rahman et al. | | |
| 7,348,844 B2 * | 3/2008 | Jaenecke | | 330/149 |
| 7,551,686 B1 | 6/2009 | Coons et al. | | |
| 7,653,147 B2 | 1/2010 | Palaskas et al. | | |
| 7,653,410 B2 | 1/2010 | Itsuki | | |
| 7,724,840 B2 * | 5/2010 | McCallister et al. | | 375/297 |
| 7,848,717 B2 | 12/2010 | Liu | | |
| 7,894,844 B2 | 2/2011 | Hiddink et al. | | |
| 7,899,416 B2 * | 3/2011 | McCallister et al. | | 455/114.3 |
| 7,904,033 B1 * | 3/2011 | Wright et al. | | 455/114.2 |
| 7,940,120 B2 | 5/2011 | Grebennikov et al. | | |
| 7,940,198 B1 | 5/2011 | Velazquez | | |
| 8,055,217 B2 * | 11/2011 | Ba et al. | | 455/114.3 |
| 8,064,851 B2 * | 11/2011 | McCallister | | 455/114.3 |
| 8,150,336 B2 * | 4/2012 | Waheed et al. | | 455/114.3 |
| 8,170,507 B2 * | 5/2012 | Wang et al. | | 455/114.3 |
| 8,195,103 B2 * | 6/2012 | Waheed et al. | | 455/114.3 |
| 2005/0143027 A1 | 6/2005 | Hiddink et al. | | |
| 2009/0061919 A1 | 3/2009 | Rofougaran et al. | | |
| 2009/0256630 A1 * | 10/2009 | Brobston | | 330/2 |
| 2010/0035554 A1 | 2/2010 | Ba et al. | | |
| 2010/0197365 A1 | 8/2010 | Ripley et al. | | |
| 2010/0311360 A1 * | 12/2010 | Huang et al. | | 455/114.3 |

* cited by examiner

*Primary Examiner* — Blane J Jackson
(74) *Attorney, Agent, or Firm* — Bay Area Technology Law Group PC

(57) ABSTRACT

Provided is a radio-frequency (RF) power amplifier system that includes a look-up table (LUT), populated with values indicative of predistortion information that is stored in a memory location, and a transmit path that includes a predistorter to receive a transmission signal (TX) and output a predistorted transmission (TX) signal, wherein the predistorted transmission signal is compensated for distortion of the transmit path, and wherein the predistorter outputs the predistorted TX signal based on the values indicative of predistortion information populated in the look-up table. The transmit path also includes a digital to analog converter (DAC) configured to receive the predistorted TX signal from the predistorter and output an analog predistorted transmission (TX) signal, and a power amplifier configured to amplify the analog predistorted TX signal.

18 Claims, 5 Drawing Sheets

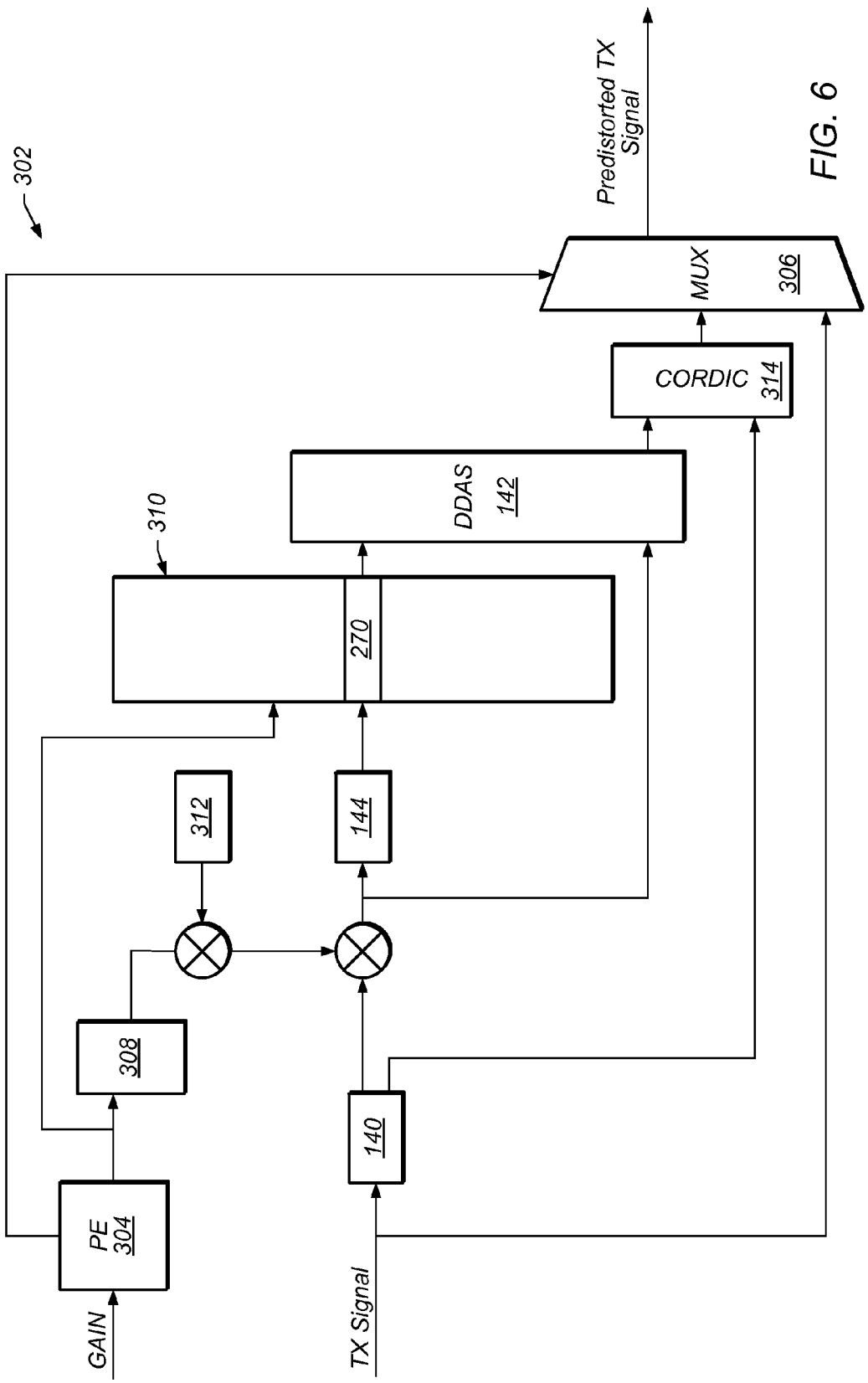

POWER AMPLIFIER LINEARIZATION SYSTEM AND METHOD

BACKGROUND OF THE INVENTION

1. Field of the Invention

This invention relates to amplifiers, and, more particularly, to systems and methods for improving linearity of power amplifiers.

2. Description of the Related Art

Electronic amplifiers are used for increasing the power and/or amplitude of various specified signals. Most amplifiers operate by taking power from a power supply, and controlling an output signal to match the shape of the input signal, while providing a higher amplitude signal. One widely used type of electronic amplifier is the power amplifier (PA). Power amplifiers are versatile devices that are used in various applications to meet design requirements for signal conditioning, special transfer functions, analog instrumentation, and analog computation, among others. Power amplifiers are often used in wireless applications, and may employ radio frequency (RF) amplifier designs for use in the radio frequency range of the electromagnetic spectrum. An RF power amplifier is a type of electronic amplifier used to convert a low-power radio-frequency signal into a signal of significant power, typically for driving the antenna of a transmitter. RF power amplifiers are oftentimes used to increase the range of a wireless communication system by increasing the output power of a transmitter.

Amplifiers are typically characterized based on their input and output characteristics. For instance, gain of an amplifier relates a magnitude of the amplifier's output signal to the magnitude of the amplifier's input signal. The gain may be specified as a ratio of an output voltage and an input voltage, or the ratio of an output power and an input power. Gain is often expressed as a transfer function of the amplifier that relates an input to an output. In most cases, the transfer function of an amplifier is expected to be linear, that is the gain is expected to have a linear relationship between the level of an input and the level of the resulting output. Nonlinear amplifiers may be subject to distortion that can vary the ratio of the input and output non-linearly, resulting in a distorted output that does not faithfully reflect the input being amplified. A non-linearity may manifest itself in an amplifier as an amplitude-dependent gain that decreases at higher amplitudes. For example, the effective gain of an amplifier may be lower for higher amplitude signals than for similar lower amplitude signals. This is commonly referred to as amplitude distortion. A non-linearity may also manifest itself as an amplitude-dependent phase shift. For example, the phase shift of the output signal may vary at different amplitudes. This is commonly referred to as phase distortion. Thus, although it is generally desirable that the output of amplifiers provide a faithful reproduction of the input signal, a faithful reproduction may not be provided due to inherent non-linearity of certain amplifiers. In an attempt to reduce the affects of the nonlinearities, the input signal may be kept low/small. Such a solution, however, may be undesirable for power amplifiers, as it limits the output power level, and lowers the efficiency of the amplifier.

Accordingly, it may be desirable to provide a technique that reduces nonlinearities across various output power levels for Power Amplifiers.

SUMMARY OF THE INVENTION

Various embodiments of power amplifier systems and related apparatus, and methods of operating the same are described. In some embodiments, provided is a method that includes transmitting a first transmission signal via an radio-frequency transmitter power amplifier of an amplifier system, receiving a first receive signal indicative of the transmission signal via a radio-frequency receiver, assessing a first set of signal information. Assessing includes determining a first input value indicative of an input characteristic including an amplitude/phase of the first transmission signal and determining a first output value indicative of an output characteristic including an amplitude/phase of the first receive signal. The method also includes determining the first output value falls within a range, and binning the first set of signal information with a second set of signal information comprising a second input value indicative of an input characteristic of a second transmission signal and a second output value indicative of an output characteristic including an amplitude/phase of a second receive signal, wherein the second output value falls within the same range as the first output value.

In certain embodiments, provided is a method of operating a transmitter. The method includes receiving a first transmit (TX) signal, obtaining a first set of input parameters having amplitude information and phase information representative of the first TX signal, generating a first TX radio frequency (RF) signal based on the first TX signal, amplifying the first TX RF signal via a power amplifier (PA), providing the amplified first TX RF signal as an input signal to a receiver path, receiving the first TX RF signal as a receive (RX) signal at the receiver path, obtaining a first set of output parameters comprising amplitude information and phase information representative of the RX signal received, and storing, in a look-up table, training information including the first set of input parameters and the first set of output parameters, where the look-up table associates the first set of input parameters with the first set of output parameters.

In certain embodiments, provided is a radio-frequency (RF) power amplifier system that includes a look-up table, populated with values indicative of predistortion information that is stored in a memory location, and a transmit path that includes a predistorter that receives a transmission signal (TX) and output a predistorted transmission (TX) signal that is compensated for distortion of the transmit path. The predistorter outputs the predistorted TX signal based on the values indicative of predistortion information populated in the look-up table. The transmit path includes a digital to analog converter (DAC) and a power amplifier configured to amplify the analog predistorted TX signal. The DAC receives the predistorted TX signal from the predistorter and outputs an analog predistorted transmission (TX) signal.

BRIEF DESCRIPTION OF THE DRAWINGS

The foregoing, as well as other objects, features, and advantages of this invention may be more completely understood by reference to the following detailed description when read together with the accompanying drawings in which:

FIG. 6 is a block diagram that depicts a portion of the amplifier system implementing a look-up table in accordance with one or more embodiments of the present technique.

Figure 1:
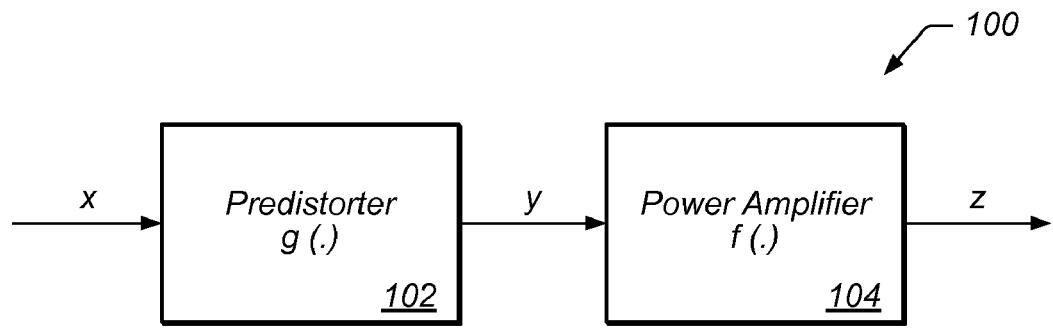
FIG. 1 is a block diagram that depicts an amplifier system in accordance with one or more embodiments of the present technique.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Headings are for organizational purposes only and are not meant to be used to limit or interpret the description or claims. Furthermore, the word "may" is used throughout this application in a permissive sense (i.e., having the potential to, being able to), not a mandatory sense (i.e., must). The term "include", and derivations thereof, mean "including, but not limited to". As used in this specification and the claims, the singular forms "a", "an" and "the" include plural referents unless the content clearly indicates otherwise. Thus, for example, reference to "an amplifier" includes a combination of two or more amplifiers. The term "coupled" means "directly or indirectly connected".

DETAILED DESCRIPTION

As discussed in more detail below, certain embodiments of the present technique include a system and method for predistotion of an amplified signal. Certain embodiments include one or more digital predistotion techniques that can be implemented to help improve output performance/characteristics of an amplifier, such as a power amplifier (PA). In some embodiments, predistortion is employed to reduce distortion in the output signal of a transmitter while maintaining a desired transmit (TX) power. In certain embodiments, predistortion is provided to compensate/offset distortion due to non-linearity of an amplifier, thereby helping to eliminate distortion at the output signal from a transmitter path of the amplifier (PA). In certain embodiments, predistortion is provided based on training or similar techniques used to characterize the amplifier. In some embodiments, an active transmission signal is looped-back to an input of a receiver path, and the looped-back active transmission signal is used for training a predistorter to compensate for non-linearity in the transmit path.

In certain embodiments, the transfer function of the PA may be estimated as a polynomial function, obtaining the coefficients of the polynomial function using adaptation techniques according to one of a number of possible different methods. In some embodiments, the coefficients of the polynomial function may be obtained through curve fitting using a least mean square (LMS) algorithm. In certain embodiments, the amplifier employs a look-up method to configure the predistorter to account for non-linearity of the transmitter. In some embodiments, the look-up method includes using a binning technique to characterize the output of the amplifier at various modes of operation. In certain embodiments, a look-up table includes coefficients or similar values that can be used to configure the predistorter. In some embodiments, a look-up table is provided for one or more gain settings of the amplifier. In certain embodiments, a single look-up table may be provided for multiple operational modes (e.g., gain settings). In some embodiments, the single look-up table includes coefficients/values that are scaled based on the operational mode (e.g., gain setting). In certain embodiments, the amplifier may employ the look-up method with little to no software/processing interaction. In some embodiments, the amplifier circuitry (e.g., the predistorter) is able to access or provided coefficients, or similar characterizing values, without having to employ significant processing, such as processing typically associated with a least mean square (LMS) algorithm to provide a curve fitting. In some embodiments, the predistortion values/coefficients are used for performing predistortion to correct for potential non-linearity in the PA output due to the inherent non-linearity of the PA. In certain embodiments, predistortion techniques may be used to correct phase error. In some embodiments, predistortion training and operation incorporates timing correction to properly align the phase of the received version of the original TX signal with the original TX signal.

Turning now to FIG. 1, depicted is a block diagram that illustrates an amplifier system 100 in accordance with one or more embodiments of the present technique. In some embodiments, amplifier system 100 includes a transmitter or transceiver that employs a power amplifier (PA) for signal transmission. As depicted, in some embodiments, amplifier system 100 includes a predistorter 102 and an amplifier 104. Amplifier 104 may include a power amplifier (PA). Amplifier 104 may include system components in addition to a PA. For example, a PA of amplifier 104 may be preceded by linear stages such as baseband and PA driver circuitry. In some embodiments, a digital to analog converter (DAC) is employed between predistorter 102 and power amplifier 104. In such an embodiment, predistorter 102 may be employed to predistort the signal to be transmitted prior to the digital-to-analog conversion to compensate for potential non-linearity in the PA output. For example, in the illustrated embodiment, predistorter 102 and power amplifier 104 are arranged in series such that an input signal 'x' is first fed through predistorter 102, generating a predistorted output signal 'y', which is then provided to power amplifier 104 as the amplifier input, where the amplifier yields the output signal 'z', as depicted. In some embodiments, output signal 'z' may include a signal with reduced or no distortion (e.g., a non-distorted signal).

To compensate for amplitude distortion, a predistorter (e.g., predistorter 102) may be configured to pre-emphasize/amplify certain amplitude signals (e.g., higher amplitude signals) to ensure that the overall effective gain—of the predistorter stage and the amplifier stage as a whole—remains the same (e.g., having a linear relationship) regardless of the amplitude of the input. In some embodiments, predistorter 102 may be configured to introduce an offsetting (e.g., negative or opposite) phase shift with respect to the inherent phase shift of the amplifier, such that the effective phase shift—of the predistorter stage and the amplifier stage together—is zero. This may ensure that the overall phase shift is constant regardless of the amplitude.

Figure 2:
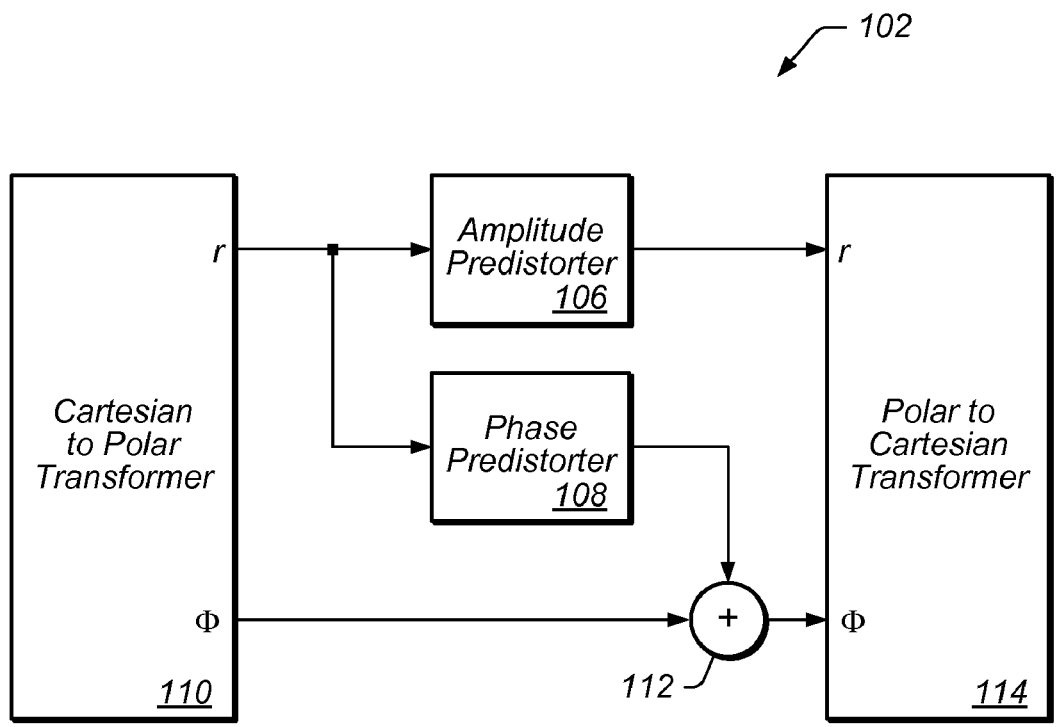
FIG. 2 is a block diagram that depicts a predistorter in accordance with one or more embodiments of the present technique.

FIG. 2 is a block diagram that depicts predistorter 102 in accordance with one or more embodiments of the present technique. In some embodiments, predistorter 102 is able to provide distortion to the incoming signal to account for amplitude distortion and/or phase distortion. In the illustrated embodiment, predistorter 102 includes an amplitude predistorter 106 and phase predistorter 108. In certain embodiments, predistorter 102 may be provided with information (e.g., distortion information) representative of the amplitude and phase distortion introduced by amplifier 100 (e.g., distortion at power amplifier 104). In some embodiments, predistorter 102 may be configured to obtain or acquire distortion information during a training operation/phase or similar calibration operation/phase. In some embodiments, predistorter 102 may employ the distortion information to appropriately distort the amplitude and phase of signal 'y' being input to power amplifier 104, such that output signal 'z' is an accurate amplified representation of input signal 'x'.

In some embodiments, predistorter 102 includes a Cartesian to polar transformer 110 and a polar to Cartesian transformer 114. Predistorter 102 may receive the transmit (TX) signal in Cartesian format (I+jQ) at Cartesian to polar transformer 110. Cartesian to polar transformer 110 may analyze the TX signal and generate a corresponding magnitude/amplitude (r) and a phase (Φ) representative of the TX signal. In certain embodiments, the amplitude and phase of the TX signal may be predistorted in amplitude predistorter 106 and phase predistorter 108, respectively, based on the distortion information. In some embodiments, phase distortion 108 may be added to the current phase (Φ), as depicted at addition block 112. The predistorted magnitude output from amplitude predistorter 106 and the predistorted phase output from phase predistorter 108 may be converted to Cartesian coordinates by polar to Cartesian transformer 114.

Predistorter 102 may use various methods to assess and determine how the appropriate amplitude distortion and/or phase distortion to account for amplitude distortion and/or phase distortion introduced in amplifier system 100. In some embodiments, for instance, training or test signals may be transmitted from the amplifier system 100 and assessed to determine a polynomial model corresponding to the transfer function of the amplifier. The polynomial model may be assessed to determine how gain and phase shifts should be varied as a function of the input amplitude. In one embodiment, the coefficients of the polynomial may be estimated during a training phase of predistorter 102, using one of a variety of possible adaptation techniques. In certain embodiments, value/coefficients may be estimated via reference to a look-up tale or similar technique that accesses stored distortion information, such as that stored in a look-up table (LUT). As described in more detail below, such a technique may use a binning technique to populate the look-up table with values. Referencing predetermined values may help to reduce the run-time processing load of the amplifier system 100. This may be attributed to using predetermined values that can be easily retrieved with little to no software interaction (e.g., processing). Other embodiments may employ a variety of techniques to estimate the coefficients. In certain embodiments, for example, estimating the coefficients includes performing curve fitting, such a least-mean square (LMS) algorithm.

Training of predistorter 102 may include functioning one or more portions of amplifier system 100 to provide distortion information and/or distortion values (e.g., coefficients) that may be used by predistorter 102 to determine how to implement amplitude and/or phase distortion. This period of operation may be referred to as predistorter training. In one embodiment, for example, at the time amplifier system 100 is powered on, predistorter 102 may enter a predistorter training mode to learn how to distort (e.g., pre-emphasize or predistort) the TX signal to yield a substantially linear signal at the overall output of amplifier system 100. Predistorter training may be provided once (e.g., at start up) or may be repeated at various times (e.g., periodically, prior to a certain type of transmission, after a gain setting change, after a set number of transmissions, or the like). Predistorter training may be used to account for distortion characteristics of amplifier system 100 that may change over time. For example, inherent distortion at power amplifier 104 may vary with temperature and/or time.

During the predistorter training, the desired predistorter polynomial coefficients may be estimated based on a reference (digital) input signal, which may be the actual TX signal—prior to its being converted to analog, upconverted to a RF band, and provided to the PA—and the PA output. In some embodiment, the transmitter output (e.g., the output of the PA) is looped-back to a receiver path (e.g., an integrated receiver of amplifier system 100). The receiver path may include circuitry for downconverting the looped-back/received signal to a baseband for analysis. In certain embodiments, characteristics (e.g., the number of samples employed) at the transmitter and the receiver may be programmable. The received signal may be assed to determine distortion information (e.g., values and coefficients) that can be employed by predistorter 102. In certain embodiments, the distortion information may be used to populate a look-up table with distortion information that can be used by predistorter 102 at a later time. In some embodiments, for example, a set of values/coefficients may be maintained for each transmitter gain setting (e.g., a table may be populated for each transmitter gain setting). Upon completion of training, the distortion information may be stored in a memory of predistorter 102 or another location of amplifier system 100, such as an onboard memory. Predistorter 102 may reference a particular look-up table to obtain distortion information related to the current gain setting, in some embodiments.

Figure 3:
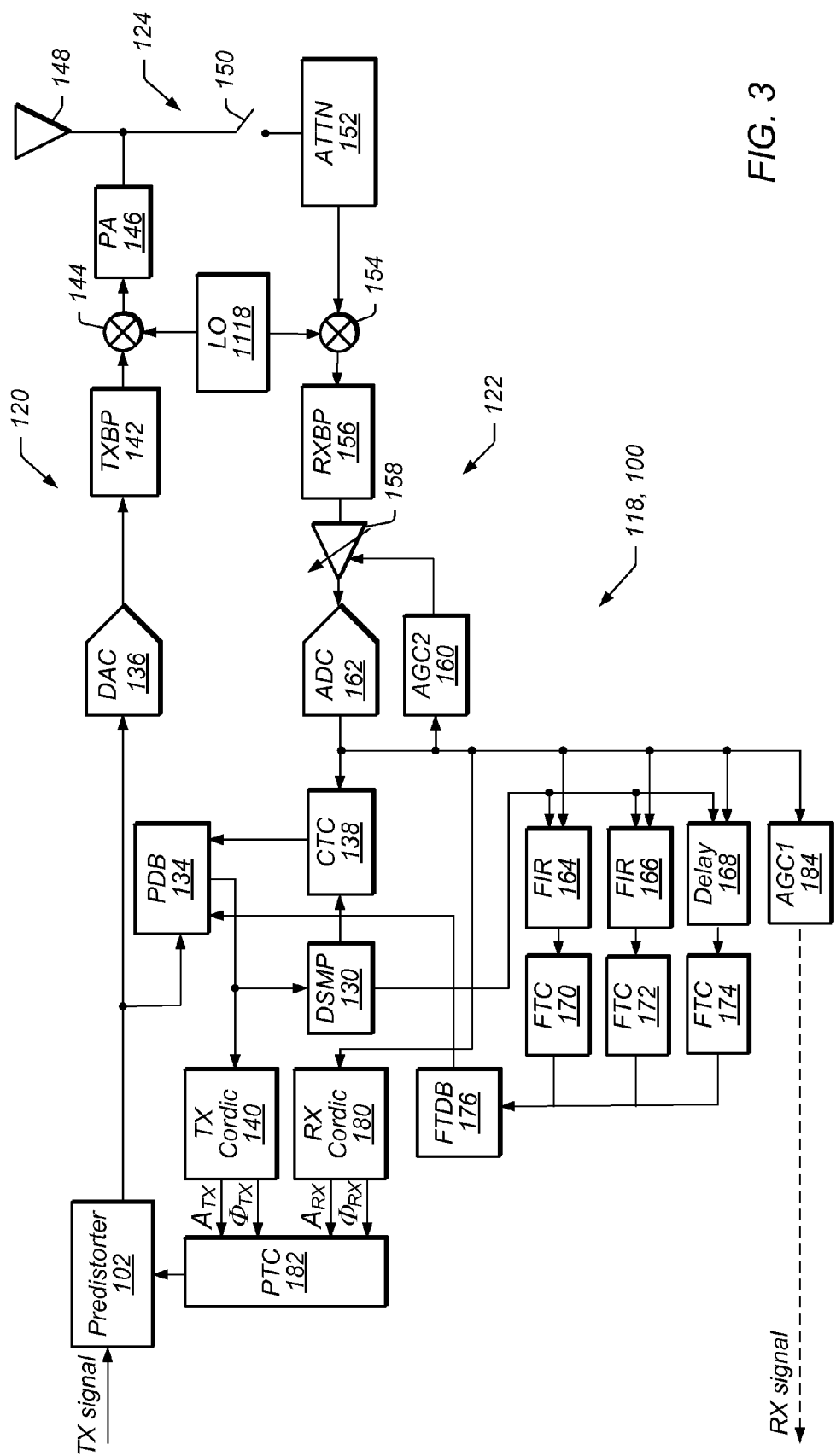
FIG. 3 is a schematic diagram of the amplifier system including the predistorter in accordance with one or more embodiments of the present technique.

FIG. 3 is a partial logic diagram of a training portion 118 of amplifier system 100 in accordance with one or more embodiments of the present technique. In the illustrated embodiment, training portion 118 includes a transmitter path 120 that is looped back to receiver path 122 via a loop-back path 124. Training portion 118 may include various portions of amplifier system 100 that are reserved for training purposes and/or may include one or more portions of amplifier system 100 that may be used for other functions. For example, where amplifier system 100 is used as a transmitter, receiver path 122 may be reserved for training purposes only. In an embodiment in which amplifier system 100 is a portion of a transceiver, receiver path 122 may include receiver circuitry used for receiving signals during normal receive operations as well as during training receive operations. For example, in the illustrated embodiment, the receive (RX) signal may be forwarded to another portion of amplifier system 100 and/or another device.

In the illustrated embodiment, training portion 118 includes predistorter 102. Predistorter 102 may include circuitry used to distort the incoming transmit (TX) signal before it is transmitted by transmitter path 120. In some embodiments, amplitude and/or phase predistortion is provided at predistorter 102 to account for amplitude distortion and phase distortion that may otherwise be present in the output signal of amplifier system 100. In some embodiments, predistorter 102 is not activated during training operation. For example, during training operations, predistorter 102 may be provided in a dormant state that enables the substantially raw TX signal to be passed to through transmitter path 120 with no or minimal predistortion. Such an embodiment may enable the training to assess and determine appropriate predistortion based on the raw TX signal. In some embodiments, predistortion may be applied at predistorter 102 during training such that the predistorted signal is passed through transmitter path 120. In such an embodiment, training may assess and determine appropriate additional predistortion relative to the already distorted transmitted signal.

In some embodiments, output of predistorter 102 may be down-sampled, as depicted at down-sampling (DSMP) block 130. In certain embodiments, the down-sampled signal may be used during the training operation. For example, the down-sampled signal may be used to match slower sampling rates of the receiver path 122 with rates of the transmitter path 120. In some embodiments, for instance, down sampling may be a "2×" or "A" down-sampling where the transmitter path 120 is operating at about 176 megahertz (MHz) and the receiver path 122 is operating at about 88 MHz.

In some embodiments, output of predistorter 102 is passed to a programmable delay buffer (PDB) 134 and to a digital to analog converter (DAC) 136. Delay buffer 134 may be used to delay passing of the signal from PDB 134. In certain embodiments, PDB 134 may adequately compensate for processing delays. Such compensation for processing delays may help to ensure that signals of TX path 120 and RX path 122 are closely aligned. In some embodiments, adequate delay may be provided in one or both of TX path 120 and RX path 122. As described in more detail below, where a coarse timing correlation operation is performed, coarse timing correlator 138 may appropriately program delay buffer 134 to delay the passage of TX signal according to the result of the coarse correlation operation. In certain embodiments, such as during the training operation, the output of the delay buffer 134 may be provided to a transmit (TX) Coordinate Rotation Digital Computer (CORDIC) 140 to generate magnitude ($A_{TX}$) and phase ($\Phi_{TX}$) information based on the TX signal. Accordingly, in some embodiments, the input to TX CORDIC 140 is representative of the TX signal, prior to the digital form of the TX signal being converted to an analog signal by DAC 136.

In some embodiments, DAC 136 may convert the TX signal from a digital to analog form. Output of DAC 136 (e.g., the analog baseband signal) may then be processed at transmit baseband processor (TXBP) 142, upconverted to an RF band by upconverter 144, and amplified by power amplifier (PA) circuit 146 of transmitter path 120. PA circuit 146 may include PA drivers and/or a power amplifier, in some embodiments. The output of PA circuit 146 is the actual transmitted signal. Upconverter 144 may be driven by a local oscillator (LO) 145. During normal transmission operations, the transmitted signal may be provided to antenna 148 for transmission. During predistorter training operations, the signal may be looped-back to receiver path 122 via loop-back path 124. The loopback path may be switchably established, and may include capacitors or other circuitry. For example, during training operations, switch 150 of loop-back path 124 may be closed to enable loop-back of the transmitted signal to attenuator (ATTN) 152. The output of PA 146 may thereby be coupled to the input of attenuator 152.

The attenuated analog RF band RX signal output from attenuator 152 may then be downconverted to an analog baseband signal by downconverter 154. The same local oscillator (LO) 145 may be used to drive upconverter 144 and downconverter 154. The use of the same oscillator may at least partially eliminate phase errors through loopback path 124.

The output of down-converter 154 may be provided to receive (RX) baseband processor (RXBP) 156, and then amplified by variable gain amplifier (VGA) 158. The gain of VGA 158 may be regulated/modified through an automatic gain control (AGC2) 160 that receives the RX signal after it passes through ADC 162. In certain embodiments, automatic gain control (AGC2) 160 may operate to remove the DC signal component, correct for quadrature imbalance, and perform automatic gain control.

The amplified analog baseband signal output from VGA 158 may be converted to a digital RX signal by analog to digital converter (ADC) 162. ADC 162 may operate at a given sampling frequency. For example, in one embodiment, ADC 162 may operate at a (sampling) frequency of 88 MHz.

Down-sampling at block 130 may correspond to the ratio of the operating frequency of the ADC 162 to DAC 136 of the transmitter path. For example, down-sampling by a factor of two (e.g., 2× or ½ down-sampling) corresponds to the transmitter path 120 operating at a frequency of about 176 MHz and the receiver path 122 operating of a frequency of about 88 MHz. The receiver path sampling rate may be determined by the operating frequency of ADC 162. As previously mentioned, the RX frequency may be lower than the TX frequency. A lower RX sampling frequency may allow for saving integrated circuit area, for example, and may be compensated for in various design modifications. Overall, the choice of TX and RX frequencies may be determined based on various systems and operating considerations, and a number of different frequencies may be considered when designing amplifier system 100. The predistortion training principles set forth herein may be equally applied to operating frequencies different from the specific valued in the disclosed embodiments.

In some embodiments, the digital RX signal output from ADC 162 may be correlated with the down-sampled digital TX signal from downsampling block 130, at coarse timing correlation block (CTC) 138. Once coarse timing correlation (e.g., up to ½ of the ADC sampling time) has been performed, CTC 138 may appropriately program delay buffer 134 to delay the TX signal according to the result of the coarse correlation operation.

Correlation may be provided in multiple phases (e.g., coarse correlation and fine correlation). Correlation may reduce hardware (HW) requirements, and timing alignment may be performed up to a specified receiver frequency. During a first stage of the predistorter training, coarse timing correlation may be performed as follows. The digital TX signal may pass through predistorter 102 without being predistorted (e.g., predistorter 102 may be disabled at this time), and may enter DAC 136, where the TX signal may be converted to the analog baseband signal. The analog baseband signal may then be processed in TXBP 141, and upconverted to RF band by upconverter 144, amplified by PA 146, and the transmitted signal may be looped/switched back via loopback path 124 into attenuator 152 of receiver path 122. During coarse timing correlation, the digital TX signal may be downsampled by a specified factor, in this case two, at downsampler 130, to provide a reference to the RX signal obtained at the output of ADC 162.

Once coarse timing correlation has been performed, fine timing correlation (e.g., up to ¼ of the ADC sampling time) may be performed during a second stage of predistorter training. It should also be noted that in other embodiments, fine timing correlation may be performed up to a finer resolution than ¼ of the ADC sampling time, when evaluating the PA transfer function as a polynomial with coefficients determined using an LMS algorithm, for example. Delaying the TX signal into TX CORDIC 140 effectively delays the input to DSMP 130 used for timing correlation. In some embodiments, the RX signal output of ADC 162 may be upsampled. In some embodiments, however, instead of actually upsampling the digital RX signal, the output from ADC 162 may be provided to finite impulse response filters (FIR) 164 and 166, and to a fine-delay block 168. For example, in some embodiments where a table-lookup method is used in determining the predistortion information, the fine aligning may be performed through banks of poly-phase filters operated at sub 88 MHz sample rates, each filter representing a step—e.g., eight stages when desiring 8× upsampling or 2 stages when desiring 2× upsampling—the correct phase selected from the filters. The output of each filter in the filter bank may be correlated to the 176 MHz TX signal, and a correct phase may be selected from these separate correlation signals. Once the signals are aligned, the coefficients for the polynomials for predistorter 102 may be determined. Coefficients may be accurately determined once the TX and RX signals have been sufficiently aligned. In some embodiment, a downsampled version of the digital TX signal (e.g., from downsampling block 130), may be provided to fine timing correlation blocks 164, 166, and 168 as a reference signal. The coefficients of polyphase filters 164 and 166 may be chosen to provide odd and even samples as if the output of ADC 162 were upsampled by a factor of two (e.g., 2× upsampling). The filter outputs from FIR 164, FIR 166, and Delay 168 may be correlated to the downsampled TX signal in fine timing correlation blocks 170, 172 and 174, respectively, and the result provided to fine timing decision block (FTDB) 176, which may assess and determine a final alignment and adjust programmable delay buffer 134 accordingly.

In some embodiments, once coarse timing correlation has been performed, the phase that was selected for the TX signal for the coarse timing correlation may also be used for performing fine timing correlation. In certain embodiments, the output from ADC 162 may be provided to finite impulse response filters (FIR) 164 and 166, and to a fine-delay block 176. A downsampled version of the digital TX signal may be provided to fine timing correlation blocks 170, 172, and 174 as the reference signal. The coefficients of filters 164 and 166 may be chosen to provide odd and even samples as if the output of single ADC 162 were upsampled by a factor of two. Thus, FIR filters 164 and 166 allow for fine-tuning by adjusting the signal in fractional steps, from odd to even phase or even to odd phase. Delay block 168 may provide a means for delaying a whole step when applicable. In other words, FTC blocks 170, 172, 174 may perform the RX signal interpolation, and once the correct phase for the RX signal has been determined, the corresponding transmitter phase (odd or even), which would be time aligned with the output signal of ADC 162, may be selected. This may allow for shutting down FIR filter stages 164 and 166. Otherwise, the phase that was selected for the TX signal for the coarse timing correlation may be used while running the correct FIR filter (corresponding to the correct phase) to generate a fine timed RX signal.

As previously mentioned, phase distortion characteristics of the PA may be determined via the loopback technique for the analog portion of the TX path 120 and/or the RX path 122. Driving upconverter 144 and downconverter 154 with the same local oscillator (LO) 145 may facilitate correlation of the phase noise that may cancel out in the loop-back path. One advantage of using the loop-back path is the capability it provides to discern the phase irregularities within the complete analog chain, regardless of where the TX PA is configured, e.g., regardless of whether the TX PA is on the same IC as the rest of amplifier system 100 or separate. Therefore, predistortion for amplifier system 100 may be performed for the entire transmitter path 120, not just for PA 146 itself.

As depicted, in some embodiments, the original digital TX signal (e.g., the TX signal prior to reaching DAC 136) may be provided to transmit (TX) CORDIC 140 via PDB 134, and the final RX digital signal (e.g., the digital RX signal output by ADC 162) may be provided to receive (RX) CORDIC 180, during the training phase, to generate the amplitude ($A_{TX}$ and $A_{RX}$) and/or phase ($\Phi_{TX}$ and $\Phi_{RX}$) information used to determine the coefficients/values for use in predistortion (e.g., for populating one or more LUTs).

In some embodiments, the amplitude ($A_{TX}$ and $A_{RX}$) and/or phase ($\Phi_{TX}$ and $\Phi_{RX}$) information is provided to a predistortion trainer and controller block (PTC) 182, which may operate to provide predistortion information to and/or configure predistorter 102 in accordance with predistortion information assessed and determined during a training operation. In some embodiments, PTC 304 may compare the respective amplitude and phase information of the two signals, e.g., compare the amplitude and phase information representative of the TX signal to the amplitude and phase information representative of the RX signal, respectively. The TX signal may be considered a 'before' signal in the sense that it represents the TX signal before it enters the transmit path via DAC 136, and consequently before it enters PA 146. Similarly, the RX signal may be considered the 'after' signal in the sense that it represents the original TX signal but after it has traveled through the transmit path 120, exited PA 146, and looped-back through the receive path 122 where it has been digitized by ADC 162. PTC 304 may obtain values/coefficients for predistorter 306 based on the comparison of the two signals, and provide those values/coefficients to predistorter 102.

As previously discussed, the values/coefficients obtained at PTC 304 may then be used by predistorter 102 to predistort the amplitude and/or phase of the TX signal during regular transmissions. In some embodiments, AGC2 160 may be used to size the signal only during the predistorter training, and sizing of an actual RX signal during regular transmission may be performed through an AGC 184. In some embodiments, the loop-back path 124 and receiver path 122 may be configured on the same integrated circuit (chip) as transmitter path 120, and may be switchably established between the output to antenna 148 and receiver path 122. In certain embodiments, such as where PA 146 is external to amplifier system 100, the loop-back may be established outside the chip/circuitry containing the transmitter path 120. The loop-back path 124 is meant to be established during training, and may be disconnected thereafter to allow amplifier system 100 to perform regular transmission and reception of signals.

Although certain embodiments of amplifier system 100 have been described in detail, other embodiments may include various other components and/or arrangements of components. For example, amplifier system 100 may include amplifier configurations, such at those described in co-pending U.S. patent application Ser. No. 12/580,709, entitled "Power Amplifier Linearization Using Digital Predistortion" by Peiris et al., filed Oct. 16, 2009, which is incorporated by reference in its entirety as if set forth herein. For example, in some embodiments, a filter (not shown) may also be provided in the receiver stage 122, e.g., between attenuator 152 and ADC 162. During predistorter training the bandwidth of this filter may be broadened in order to not lose the non-linearity (side lobe information). That is, during predistorter training, the filter bandwidth may be relaxed to provide more accurate characterization.

Predistorter 102 may also be configured to store different sets of coefficients for one or more gain setting, from which the appropriate set of values/coefficients may be selected and used for predistortion during normal transmission. As discussed above, in some embodiments, predistortion information (e.g., values/coefficients) based on the results of the training operation may be stored in a memory and retrieved at a later time. In some embodiments, a look-up table (LUT) method is used to store/retrieve the appropriate predistortion information based on the distortion characteristics assessed and determined during the training operation. In some embodiments, the predistorter provides a predistortion based on predistortion information acquired during the training portion. In certain embodiments, the predistortion information is stored in a memory location and may be retrieved/accessed to determine if and how predistortion should be applied to the signal output by amplifier system 100. For example, where an amplifier system output is non-linear (e.g., outputs relatively low amplitude as a function of higher gains) the predistorter may retrieve values/coefficients indicative of the difference and appropriately modify the signal such that the resulting output accounts for the non-linearity, and outputs a signal at the desired level. In one embodiment, the predistortion information is provided via a look-up table. For example, in one embodiment, a look-up table includes a plurality of output vales versus input values. In certain embodiments, the predistorter may assess the relationships and, where a given output is desired, select the complementary input value to provide the desired output. Accordingly, in some embodiments, predistorter 102 may adjust/offset the input signal based on predistortion information stored in the look-up table, to provide an output that compensates for non-linearity of amplifier system 100.

Figure 4:
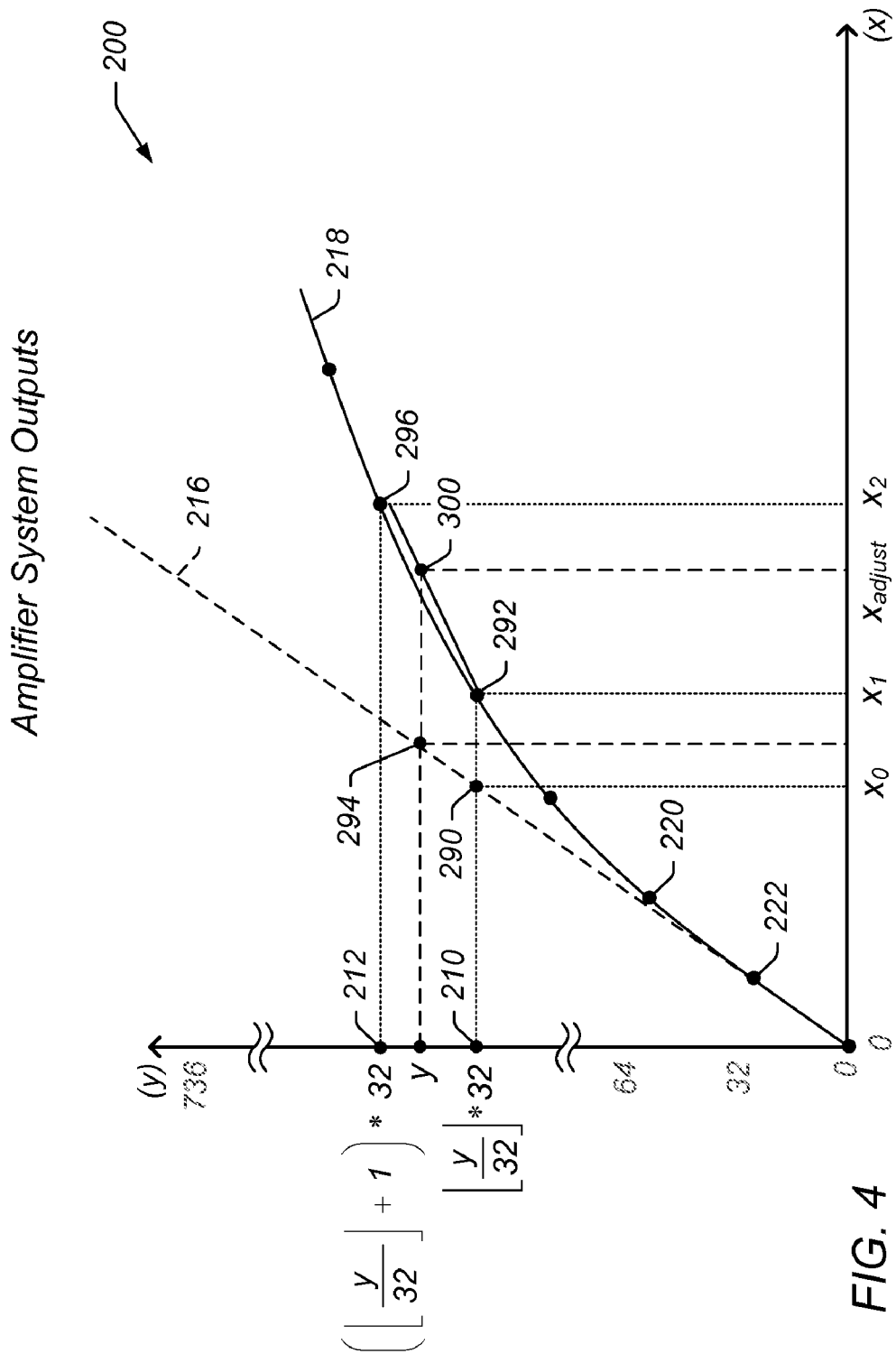
FIG. 4 is a plot that illustrates output of an amplifier system, in accordance with one or more embodiments of the present technique.

FIG. 4 is a plot 200 that illustrates amplifier system output (linear and non-linear), in accordance with one or more embodiments of the present technique. In the illustrated embodiment, the x-axis represents an amplifier input (e.g., input to DAC 136 of FIG. 3) and the y-axis represents the amplifier output (e.g., output from PA 146 of FIG. 3). In one embodiment, the y-axis is scaled in accordance with the full-range resolution of the input (e.g., in accordance with the full resolution of ADC 162). For example, in the illustrated embodiments, the y-axis is representative of a 10-bit ADC having a resolution of +/−512 (e.g., $2^{10}$=1024 or +/−512). In such an embodiment, the amplitude of the received signal may be in the range of 0 to 724 (e.g., (sqrt(2))*512=724). In some embodiments, the full scale is adjusted to fit within hardware. For example, the y-scale is modified to 0 to 736 to align with hardware.

In certain embodiments, the y-scale is split into ranges. For example, the 736 is split into bin sizes of 32 (e.g., +/−16), for a total of 23 bins (e.g., 736/32=23). In the illustrated embodiment, the 32-size bins are represented by the increments of 32 along the y-axis having a bin that extends +/−16 from the demarcated increment. The points 210 and 212 are representative of two of those increments. For example, where point 210 is representative of the next increment after 64, the increment at point 210 has a y-value of 96 and the increment at point 212 has a y-value of 128.

In the illustrated embodiment, two curves are provided. A first curve includes a linear relationship represented by dashed line (linear curve) 216. Linear curve 216 is representative of a linear relationship, where the output (y-axis) includes a linear relationship with regard to the input (x-axis). For example, in the illustrated embodiment, the linear curve may be representative of a relatively proportional amplitude/phase output (y-axis) of amplifier system 100 across all input amplitude (x-axis). A second curve includes a non-linear relationship represented by solid line (non-linear curve) 218. Non-linear curve 218 may be representative of a non-linear relationship, where the amplitude/phase output (y-axis) of amplifier system 100 includes a non-linear relationship with regard to the amplitude/phase input (x-axis). The non-linear curve may be representative of a disproportionately lower amplitude output (y-axis) at higher gain values (x-axis). As described above, linear curve 216 may be representative of a desired output of amplifier system 100, where as the non-linear curve 218 may be representative of the actual output of amplifier system 100 (e.g., without implementing predistortion).

In some embodiments, linear curve 216 and/or non-linear curve 218 are assessed and determined using a binning technique. In certain embodiments, binning includes observing the responses (e.g., the received output) over a wide variety of inputs, grouping the values into ranges (e.g., bins) and averaging these values as over the ranges to provide discrete points on the plot that are representative of the relationship between the inputs and the outputs. In some embodiments, binning includes dividing the output (e.g., the y-axis) into discrete bins, and averaging the output values for the points that fall within each bin to determine an average output bin value for a set of points within the bin, as well as averaging the input values for the points that fall within the bin to determine an average input bin value for the set of points. The average output bin value and the average input bin value are paired as a representative point on a curve representing the actual response of amplifier system 100 (e.g., non-linear curve 218). In some embodiments, such as that illustrated, the bins are sized to match the increment of the y-axis and, thus, extend above the increment by ½ the bin size and below the increment by ½ the bin size. For example, the bin (e.g., having a size 32) at increment "64" of the y-axis may be in the range of 48 to 80. Thus, to determine an average output (bin) point 220, the y-values and x-values of the resulting outputs obtained during training over a range of inputs having an output (y) that falls within the range of 48 to 80 may be averaged to provide the y and x value of bin point 220. Accordingly, during training, a sweep may be made across the various inputs at one or more gain levels to provide numerous output values, and the results binned into discrete ranges and averaged to determine at least one point for each of the ranges. Non-linear curve 218 may be representative of multiple bin points resulting from such a technique. For example, curve 218 includes average points at bins centered at 0, 32, 64, point 210, point 212, and so forth. Note, the bin at zero extends from 0 to 16, but may not include negative values.

In some embodiments, linear curve 216 may be obtained based on non-linear curve 218. In certain embodiments, linear curve 216 includes a line that is tangent to non-linear curve 218 at one or more locations. In the illustrated embodiment, for example, linear curve 216 is tangent to non-linear curve 216 at lower input values (e.g., smaller x values). In one embodiment, linear curve 216 may be tangent to two or more of the first bin points. For example, in one embodiment, linear curve 216 may be a line that extends through the bin point at (0,0) and the bin point of the adjacent bin (e.g., bin point 222 of the bin associated with output value 32). In some embodiments, plots are provided for one or more modes of operations. For example, in one embodiment, a plot similar to plot 200 is provided for each gain setting of amplifier system 100. In some embodiments, none or a single plot may be provided at gain settings where non-linearity is not present (e.g., lower gain settings), or where non-linearity is not expected to be present. One or more plots may be provided for higher gain settings where non-linearity is present or is expected to be present.

Figure 5:
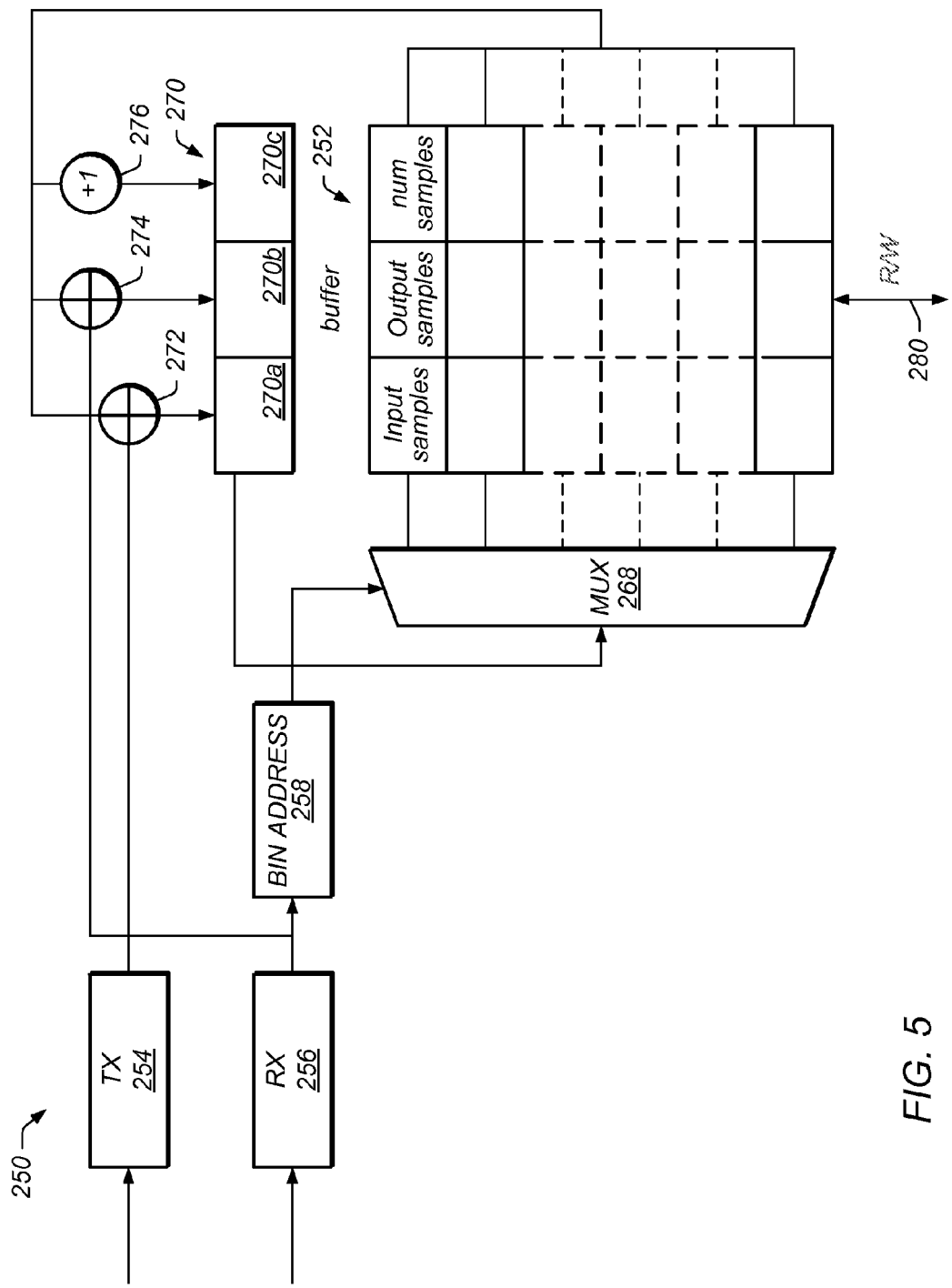
FIG. 5 is a block diagram that depicts a system for populating a look-up table in accordance with one or more embodiments of the present technique.

In certain embodiments, the bin values are stored such that they can be retrieved at a later time. FIG. 5 is a block diagram that depicts a distortion information system 250 for populating a look-up table 252 in accordance with one or more embodiments of the present technique. In some embodiments, distortion information system 250 may be provided in predistortion trainer and controller block (PTC) 182 and/or predistorter 102 (See FIG. 3). For example, system 250 may populate loop-up table 252 in a memory of PTC 182, predistorter 102, or another location in amplifier system 118. The stored information may be accessed and retrieved by PTC 182 and/or predistorter for determining how to predistort a TX signal. In the illustrated embodiment, transmission information is received at transmission input block 254 and receive information is received at receive input block 256. In some embodiments, transmission information is provided from transmit CORDIC 140 and/or receive information is provided from receive CORDIC 180 (See FIG. 3). Transmission information may include amplitude and/or phase information.

In certain embodiments, the transmission information and the receive information comprises a set of amplitude and/or phase information paired with one another. For example, the receive information may be representative of the received signal that was produced as a result of the transmitted signal associated with the transmission information. The transmit information may be representative of the digital signal to be output before being converted to an analog signal by DAC 136, and the receive information may be representative of the resulting received analog signal after it has be converted to a digital signal at ADC 162.

In some embodiments, the receive information is provided to bin address block 258. Bin address block 258 may assess the received information to determine what bin the information should be associated with. For example, where the receive information includes an amplitude/phase that is in the range of 48 to 80 (See FIG. 4), bin address block 258 may associate the transmission information and the receive information with bin address 62. The bin address provided by bin address block 258 may be forwarded to multiplexer (MUX) 268 such that it can associate the incoming transmission and receive information with the correct cell/address (bin) of lookup table 252. As each set of transmission information and receive information is received, the receive information may be assessed at bin address block 258 such that the appropriate bin address can be determined and passed to MUX 268.

In certain embodiments, information (e.g., the transmission and receive information) is accumulated for each bin address. In some embodiments, look-up table 252 includes a line associated with each bin address. In some embodiments, the lines are representative of multiple input and output samples based on the transmission and receive information. For example, in some embodiments, such as that depicted in FIG. 5, an assembled line of bin data 270 is assembled prior to being added to look-up table 252. In one embodiment, line of bin data 270 includes an input samples block 270a representative of input samples, which may be indicative of the transmission information and/or the input signal, an output samples block 270b representative of output samples, which may be indicative of the receive information and/or the actual input signal received from ADC 162, and a number of samples block 270c that may reflect the number of times transmission and receive data sets have been added to the respective bin (e.g., the total number of samples in the bin).

In one embodiment, the line of bin data 270 associated with the determined bin address is retrieved, and the transmission data and the receive data is added to the list of samples in the line of data as depicted at adders 272 and 274. In some embodiments, the number of samples is updated (e.g., incremented +1) at incrementer 276 to reflect another sample being added to the assembled line of bin data. In some embodiments, a list of the input samples and the output samples may be maintained in each of the input samples block 270a and the output samples block 270b. In some embodiments, to find an average value for each bin, the total of the values in each block (270a and 270b) may be divided by the number of samples. The resulting average values for input samples block 270a and output samples block 270b may be representative of a bin point. For example, the average value of input samples block 270a may be representative of the x-axis value of bin point 220 (See FIG. 3), and average value the output sample block 270b may be representative of the y-axis value of bin point 220, where assembled line of bin data is associated with a bin address of "62" as determined at bin address block 258. In some embodiments, an average value for the input samples block 270a and/or output samples block 270b may be maintained. For example, as values are added to blocks 270a and 270b, the total value may be averaged based on the number of samples. In such an embodiment, a separate technique may be used to keep a running average and number of samples block 270a may not be necessary.

In some embodiments, the data populated to look-up table 252 is accessible such that a portion of amplifier system 100 may use the stored information to assess and determine what, if any, predistortion should be applied and/or how it should be applied. For example, in the illustrated embodiment, look-up table 252 may be accessed via a read/write (R/W) path 280. In one embodiment, R/W path 280 may be accessible by PTC 182 and/or distorter 102.

In some embodiments, the distortion information stored in look-up table 252 may be representative of a curve similar to that of non-linear curve 218 depicted in FIG. 4. For example, as discussed above, each line of line of bin data 270 may be associated with one or more of the bin points that define non-linear curve 218. In certain embodiments, predistortion may be provided to amplifier system 100 based on the differences between non-linear curve 218 and linear curve 216. For example, in the illustrated embodiment, the magnitude of the input may be increased (e.g., to an adjusted input value) such that the resulting output more closely tracks that of linear curve 216. In some embodiments, the adjusted input value is applied to the signal to be transmitted such that is adjusted/predistorted prior to being transmitted. For example, where an output level ("y") associated with an output point 290 is desired, instead of using an input value associated with the value ("$x_0$") of output point 290, an adjusted "$x_1$" value is used associated with bin point 292, such that the resulting output level is that same or similar that of output point 290.

In some embodiments, the desired output level may not be at or near the level of a bin point. In certain embodiments, the input level may be determined by interpolating between two or more bin points. For example, where the desired output level is that of output point 294, interpolation between the two adjacent bin points 292 and 296 may be provided to assess and determine an input value that may provide an output level at or near the desired output level. In one embodiment, a linear interpolation between the two points may be provided. In one such embodiment, the adjusted input value ($x_{adjust}$) may be determined as:

$$x_{adjust} = x_1 + \left[\left(\frac{x_2 - x_1}{\Delta_y}\right) * \left(y - \frac{y}{\Delta y}\right)\right] \quad (1)$$

where y is the desired output level, $x_1$ is the input value of the first bin point (e.g., bin point 292), $x_2$ is the input value of the second bin point (e.g., bin point 296), and $\Delta_y$ is difference between the output level at each bin point (e.g., the bin size, such as 32 between points 292 and 296). An adjusted point 300 may include ($x_{adjust}$, y).

In some embodiments, multiple tables may be provided to characterize the predistortion for amplifier system 100. In certain embodiments, a table may be provided for each gain of the amplifier, or for each gain where non-linearity may occur in which predistortion may be useful. For example, in some embodiments, lower gains may not be associated with a look-up table, whereas higher gains may be associated with look-up tables to provide predistortion information to the predistorter. In certain embodiments, the look-up table may be referenced/selected based on the gain of amplifier system 100.

FIG. 6 is a block diagram that depicts a look-up portion 302 of amplifier system 100 implementing one or more look-up tables in accordance with one or more embodiments of the present technique. Such a technique may be implemented by predistorter 102 and/or PTC 182. In some embodiments, look-up portion 302 includes a gain input to predistortion enable (PE) block 304. PE block 304 may assess the gain input to determine whether or not to implement predistortion. For example, if the gain is associated with little to no non-linearity, PE 304 may provide an output to disable predistortion, as it may be expected that the output falls at or near the desired output level without predistortion. If the gain is expected to produce significant non-linearity, PE 304 may provide an output to enable predistortion, as it is expected the output may fall too far from the desired output level. In some embodiments, an enable signal is passed to a multiplexer 306 that may be used to implement predistortion or forward (e.g., without predistortion) the input signal to be transmitted. For example, where predistortion is disabled, the raw input signal (e.g., TX signal) may be routed to and through MUX 306 without having predistortion applied to the signal.

In some embodiments, such as where predistortion is enabled, the gain may be assessed to determine which look-up table should be used. Where only one look-up table is present, such a step may not be necessary and the system may apply distortion based on the single look-up table. In one such embodiment, a single look-up table may be used, and values may be scaled to account for variations in gains other than the gain used to assess the LUT. For example, the look-up is done based on a signal prescaled to account for the difference between the desired gain and the gain at which predistortion calibration is done.

In a single table approach, it may be assumed that power amplifier 104 is modeled as a power amplifier with a single gain setting preceded by a linear amplifier stages which may have variable gain settings. These linear stages can be either baseband or RF amplifiers. In the single table approach, power amplifier 104 is trained for the highest acceptable power level (e.g., at the highest usable gain settings for linear stages). Once the power amplifier 104 is trained for highest gain settings, the derived pre-distorter table can be directly used for that particular gain setting. In the single table approach, this derived pre-distorter table is used for a set of gain settings lower than the trained gain setting without further training. This may include simply pre-scaling the signal at the input to pre-distorter 102 and by post scaling the signal at output of pre-distorter 102 (e.g., as derived for the highest gain setting). In some embodiments, when selecting scaling it may be assumed that power amplifier 104 is trained with linear stages having a gain of "$G_{trained}$", having already created a pre-distorter table for that gain setting. If predistorter 102 trained at "G-Trained" is to be reused to do the pre-distortion for linear stages having a target gain of "$G_{target}$" then if the pre-scaling factor is selected to be:

$$Prescaling factor = \sqrt{\frac{G_{target}}{G_{trained}}} \quad (2)$$

and the post scaling factor to be:

$$Post scaling factor = \sqrt{\frac{G_{trained}}{G_{target}}} \quad (3)$$

the combined pre-scalar, pre-distorter derived at $G_{trained}$ and post-scalar will act as a pre-distorter created by training at $G_{target}$. Knowledge of absolute gain values (which might change with temperature) of linear stages is not required, as a knowledge of the ratio of gain difference may be sufficient and doest not normally changes with the temperature.

Where multiple look-up tables are provided, however, PE 304 may provide an output that is used to determine the correct look-up table to use. For example, where a look-up table is associated with the gain, the PE 304 may activate the associated look-up table for use. In one embodiment, for instance, lower gain values may be associated with a small gain look-up table 308, and higher gain values may be associated with a higher gain look-up table 310. In some embodiments where the small gain lookup table 308 is used, look-up values and/or scaling may be applied, as depicted at scaling block 312. The scaled input may be associated with the signal information provided from TX CORDIC 140, and passed directly to predistortion amplitude and scaling (PDAS) block 142, or passed to index block 144. Index block 144 may extract the desired output level (y) such that the appropriate line of bin data 270 of look-up table 310 may be assessed. Based on the index received from index block 144, the lines of bin data associated with the bounding bin points may be extracted for use at PDAS 142. For example, with reference to FIG. 4, where the desired level is "y", the lines of bin data associated with bin points 296 and 292 may be extracted. The extracted data from lookup table 310 may be passed to PDAS 142. PDAS 142 may assess the extracted data to determine the appropriate predistortion to apply. For example, in one embodiment, an input to PDAS 142 may include the desired output (e.g., "y") and, PDAS 142 may linearly interpolate between the two bounding lines of bin data extracted to determine the desired adjustment/predistortion to be applied to the TX signal. PDAS 142 may provide an adjusted value to CORDIC 314, and CORDIC 314 may assess the information provided from TX CORDIC 140 (e.g., amplitude and phase information) and the adjusted value provided by PDAS 142, and PDAS 142 may output an associated predistorted signal for output from MUX 306. The predistorted TX signal may be transmitted and output via transmitter path 120, for instance (See FIG. 3).

In some embodiments, a similar technique is employed for implementing predistortion to account for amplitude distortion and/or phase distortion. For example, look-up table may be provided for one or both of adjusted amplitude and adjusted phase values.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
   transmitting a non-predistorted first transmission signal via a radio-frequency transmitter power amplifier of an amplifier system;
   receiving a first receive signal indicative of the non-predistorted first transmission signal via a radio-frequency receiver;

assessing a first set of signal information comprising:
  determining a first input value indicative of an input characteristic comprising an amplitude/phase of the non-predistorted first transmission signal; and
  determining a first output value indicative of an output characteristic comprising an amplitude/phase of the first receive signal;
determining the first output value falls within a range;
binning the first set of signal information with a second set of signal information comprising a second input value indicative of an input characteristic of a second transmission signal and a second output value indicative of an output characteristic including an amplitude/phase of a second receive signal, wherein the second output value falls within the same range as the first output value; and
generating a predistorted transmission signal, comprising:
  receiving an input signal to be transmitted;
  determining that the input signal is to be transmitted with an output characteristic that falls within the range;
  retrieving the first set of signal information and the second set of signal information;
  determining an input average value, comprising averaging at least the first input value and the second input value of the second set of signal information;
  determining an output average value, comprising averaging at least the first output value and the second output value;
  determining a final input value indicative of an amplitude/phase based on the input average value and the output average value;
  predistorting an incoming signal in accordance with the amplitude/phase indicated by the final input value; and
  generating the predistorted transmission signal from the predistorted incoming signal.

2. The method of claim 1, wherein the incoming signal is predistorted prior to being input to the radio-frequency transmitter power amplifier of the amplifier system.

3. The method of claim 1, wherein the incoming signal is predistorted prior to being input to a digital to analog converter (DAC) of a transmitter path of the amplifier system.

4. The method of claim 1, comprising operating the amplifier system at a first gain setting.

5. The method of claim 4, comprising operating the amplifier system at a second gain setting different from the first and repeating the method steps of claim 1.

6. The method of claim 1, wherein binning the first set of signal information with a second set of signal information comprises storing the first set of signal information in a look-up table (LUT).

7. The method of claim 1, wherein the first input value is determined based on a digital form of the non-predistorted first transmission signal prior to being provided to a digital-to-analog converter (DAC) of a transmitter path of the amplifier system.

8. The method of claim 1, wherein the second output value is determined based on a digital form of the first receive signal after being provided to an analog-to-digital converter (ADC) of a receiver path of the amplifier system.

9. The method of claim 1, wherein determining a final input value based on the input average value and the output average value comprises interpolating between a first average value and a second average value of a first set of data and a first average value and a second average value of another set of data, to determine a first transmission value and a second transmission value, wherein the interpolation provides the final input value.

10. A method of operating a transmitter, comprising:
receiving a non-predistorted first transmit (TX) signal;
obtaining a first set of input parameters comprising amplitude information and phase information representative of the non-predistorted first TX signal;
generating a first TX radio frequency (RF) signal based on the non-predistorted first TX signal;
amplifying the non-predistorted first TX RF signal via a power amplifier (PA);
providing the amplified non-predistorted first TX RF signal as an input signal to a receiver path;
receiving the non-predistorted first TX RF signal as a receive (RX) signal at the receiver path;
obtaining a first set of output parameters comprising amplitude information and phase information representative of the RX signal received;
storing, in a look-up table, training information comprising the first set of input parameters and the first set of output parameters, wherein the look-up table associates the first set of input parameters with the first set of output parameters;
binning the first set of input parameters and the first set of output parameters into a bin of a look-up table based on a range the first set of output parameters falls within, wherein the bin comprises other first sets of parameters and other second sets of parameters; and
averaging the first set of input parameters with other sets of input parameters within the bin, and averaging the first set of output parameters with other sets of output parameters stored within the bin, to determine an average input parameter and an average output parameter.

11. The method of claim 10, further comprising:
receiving a second transmit (TX) signal,
predistorting the second transmit (TX) signal, comprising:
  obtaining a second set of input parameters comprising amplitude information and phase information representative of the second TX signal;
  matching the second set of input parameters with a range of a bin of the look-up table having training information comprising the first set of input parameters and the first set of output parameters stored therein;
  determining distortion information based on the training information stored in the bin; and
  predistorting the second transmit (TX) signal based on the distortion information.

12. The method of claim 11, comprising transmitting the distorted second TX signal, comprising:
generating a second TX radio frequency (RF) signal based on the distorted second TX signal; amplifying the second TX RF signal via the PA; and
outputting the amplified second TX RF signal.

13. The method of claim 10, wherein the look-up table is associated with a gain setting of the transmitter.

14. The method of claim 10, wherein storing, in a look-up table, training information including the first set of input parameters and the first set of output parameters comprises selecting one of a plurality of look-up tables based on a gain setting of the transmitter used during transmitting of the second TX signal.

15. The method of claim 10, wherein matching the second set of input parameters with a range of a bin of the look-up table having the first set of input parameters and the first set of output parameters stored therein comprises matching the second set of input parameters to two bins of the look-up table, and wherein determining distortion information based on information stored in the bin comprises interpolating between values associated with the two bins.

16. A radio-frequency (RF) power amplifier system, comprising:
- a look-up table stored in a memory location, wherein the look-up table is populated with values indicative of predistortion information; and
- a transmit path comprising:
  - a predistorter configured to output predistorted TX signals based on the values indicative of predistortion information populated in the look-up table;
  - a digital to analog converter (DAC) configured to receive TX signals from the predistorter and output analog transmission (TX) signals; and
  - a power amplifier configured to amplify the analog TX signals, wherein the predistorter is further configured to:
- receive a non-predistorted first TX signal;
- obtain a first set of input parameters comprising amplitude information and phase information representative of the non-predistorted first TX signal;
- generate a first TX RF signal based on the non-predistorted first TX signal;
- amplify the non-predistorted first TX RF signal via the power amplifier;
- provide the amplified non-predistorted first TX RF signal as an input signal to a receiver path;
- receive the non-predistorted first TX RF signal as a receive (RX) signal at the receiver path;
- obtain a first set of output parameters comprising amplitude information and phase information representative of the RX signal received;
- store in the look-up table training information comprising the first set of input parameters and the first set of output parameters, wherein the look-up table associates the first set of input parameters with the first set of output parameters;
- bin the first set of input parameters and the first set of output parameters into a bin of the look-up table based on a range the first set of output parameters falls within, wherein the bin comprises other first sets of parameters and other second sets of parameters; and
- average the first set of input parameters with other sets of input parameters within the bin, and average the first set of output parameters with other sets of output parameters stored within the bin, to determine an average input parameter and an average output parameter.

17. The RF power amplifier system of claim 16, wherein the look-up table is configured to be populated with values indicative of predistortion information during a training operation wherein an output of the transmit path is looped back to a receive path configured to assess the output of the transmit path.

18. The RF power amplifier system of claim 17, wherein the predistorter is configured to apply amplitude distortion and/or phase distortion based on the predistortion information populated in the look-up table.

* * * * *